(12) United States Patent
Murata et al.

(10) Patent No.: US 9,878,353 B2
(45) Date of Patent: Jan. 30, 2018

(54) STOCKER PROVIDED WITH PURGING FUNCTIONALITY, STOCKER UNIT, AND METHOD FOR SUPPLYING CLEANING GAS

(71) Applicant: Murata Machinery, Ltd., Kyoto-shi, Kyoto (JP)

(72) Inventors: Masanao Murata, Ise (JP); Takashi Yamaji, Ise (JP)

(73) Assignee: MURATA MACHINERY, LTD, Kyoto (JP)

( * ) Notice: Subject to any disclaimer, the term of this patent is extended or adjusted under 35 U.S.C. 154(b) by 77 days.

(21) Appl. No.: 14/421,215

(22) PCT Filed: Jun. 21, 2013

(86) PCT No.: PCT/JP2013/067083
§ 371 (c)(1),
(2) Date: Feb. 12, 2015

(87) PCT Pub. No.: WO2014/030421
PCT Pub. Date: Feb. 27, 2014

(65) Prior Publication Data
US 2015/0202664 A1 Jul. 23, 2015

(30) Foreign Application Priority Data
Aug. 21, 2012 (JP) ................. 2012-182191

(51) Int. Cl.
*B08B 5/02* (2006.01)
*B65G 1/00* (2006.01)
(Continued)

(52) U.S. Cl.
CPC ................. *B08B 5/02* (2013.01); *B65G 1/00* (2013.01); *B65G 45/00* (2013.01);
(Continued)

(58) Field of Classification Search
CPC ......... H01L 21/67769; H01L 21/67389; H01L 21/67393; H01L 21/67775; B08B 5/02; B65G 1/00; B65G 45/00; Y10T 137/4238
See application file for complete search history.

(56) References Cited

U.S. PATENT DOCUMENTS 6,123,120 A * 9/2000 Yotsumoto ........ H01L 21/67389
141/59
2003/0000898 A1 1/2003 Elliott
(Continued)

FOREIGN PATENT DOCUMENTS

JP 2010-182747 A 8/2010
JP 2010-241515 A 10/2010
WO 2008/106622 A2 9/2008

OTHER PUBLICATIONS

Machine Translation of Nishina et al., JP 2010-182747, Aug. 2010.*
(Continued)

*Primary Examiner* — David G Cormier
(74) *Attorney, Agent, or Firm* — Keating & Bennett, LLP

(57) ABSTRACT

A stocker includes cells including a purge function and cells not including the purge function. A cell not including the purge function is easily changed to a cell that includes the purge function. The stocker includes a frame to which multiple cell supports not including a cleaning gas supplying nozzle are configured to be attached along the vertical direction or the horizontal direction, and the base of a stocker unit is attached to the frame. The stocker unit includes a pipe configured to supply cleaning gas that is provided along the base, and multiple cell supports including the purge function that are attached to the base and are aligned along the vertical direction or the horizontal direction. Each cell support preferably is configured to support a
(Continued)

container and includes a nozzle configured to supply cleaning gas from the pipe to the container.

5 Claims, 3 Drawing Sheets

(51) Int. Cl.
    *B65G 45/00*     (2006.01)
    *H01L 21/677*     (2006.01)
    *H01L 21/673*     (2006.01)

(52) U.S. Cl.
    CPC .. *H01L 21/67393* (2013.01); *H01L 21/67769* (2013.01); *H01L 21/67775* (2013.01); *Y10T 137/4238* (2015.04)

(56) References Cited

U.S. PATENT DOCUMENTS

| | | |
|---|---|---|
| 2008/0156069 A1 | 7/2008 | Murata et al. |
| 2010/0089491 A1 | 4/2010 | Pan |

OTHER PUBLICATIONS

Official Communication issued in International Patent Application No. PCT/JP2013/067083, dated Aug. 27, 2013.
Official Communication issued in corresponding European Patent Application No. 13830946.3, dated Mar. 31, 2016.

\* cited by examiner

F I G. 3
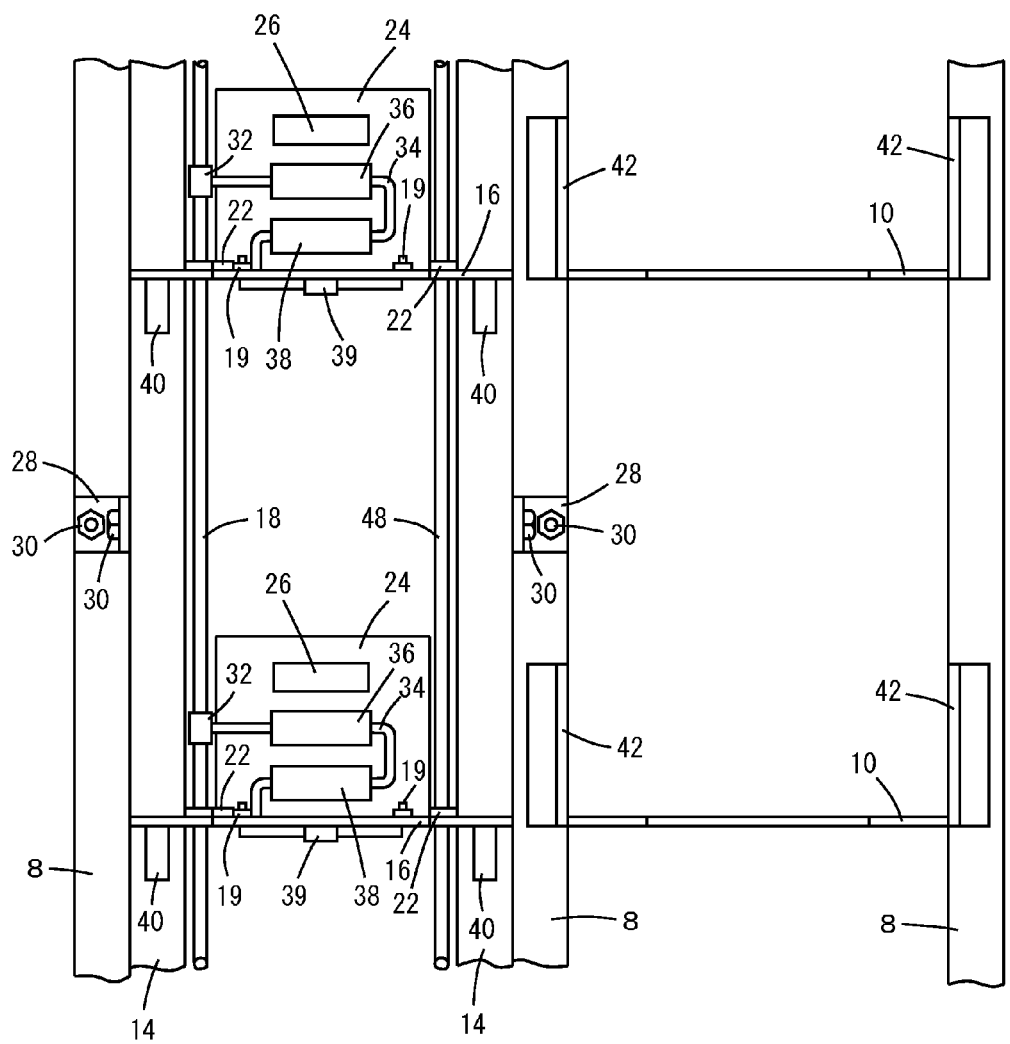

STOCKER PROVIDED WITH PURGING FUNCTIONALITY, STOCKER UNIT, AND METHOD FOR SUPPLYING CLEANING GAS

BACKGROUND OF THE INVENTION

1. Field of the Invention

The present invention relates to a stocker including a purge function, a stocker unit, and a method for supplying cleaning gas to a container in a stocker.

2. Description of the Related Art

Workpieces handled in a clean room, such as semiconductor wafers and reticles, are transported and stored while being housed in a container such as an SMIF (Standard Mechanical Interface) pod or an FOUP (Front Opened Unified Pod). It has been proposed to keep the interior of the container locally clean by introducing a cleaning gas such as nitrogen ($N_2$ gas) or cleaned and dried air through a gas inlet of the container. Nitrogen gas in particular also serves the role of preventing the formation of an oxide film on the surface of semiconductor wafers. JP 2010-241515A proposes a stocker having a nozzle that supplies cleaning gas to a container, and WO 2008/106622 (JP 2010-520625A) proposes an SMIF pod having a gas inlet for storing reticles.

With the stocker proposed in JP 2010-241515A, all of the cells are compatible with the purge function, and it is not possible for cells compatible with the purge function and cells not compatible with the purge function to coexist. If some of the cells are not provided with a purging tube (purging line), those cells cannot be used for purging. If the purge function is to be added to an existing stocker that does not have purging lines, it is necessary to replace the existing stocker with a new stocker. In the case of altering the stocker in a clean room instead of replacing it with a new stocker, there are limits on the work time and work space, and the raising of dust needs to be prevented, thus making alteration difficult.

SUMMARY OF THE INVENTION

Preferred embodiments of the present invention provide a stocker in which cells including a purge function and cells not including the purge function may coexist, and a cell not including the purge function may be easily changed to a cell that includes the purge function.

A stocker including a purge function according to a preferred embodiment of the present invention includes a frame to which a plurality of cell supports not including a cleaning gas supplying nozzle are configured to be attached along a vertical direction or a horizontal direction, and a stocker unit including a base including a column or a beam and is attached to the frame, a pipe configured to supply cleaning gas that is provided along the base, and a plurality of cell supports including a purge function, the cell supports including a purge function being attached to the base, aligned along the vertical direction or the horizontal direction, configured to support a container, and each including a nozzle configured to supply cleaning gas from the pipe to the container.

Also, a stocker unit according to a preferred embodiment of the present invention includes a base including a column or a beam and configured to be attached to a frame of a stocker, a pipe configured to supply cleaning gas that is provided along the base, and a plurality of cell supports including a purge function that are attached to the base and are aligned along the vertical direction or the horizontal direction, the cell supports including a purge function being configured to support a container, and each including a nozzle configured to supply cleaning gas from the pipe to the container.

A method for supplying cleaning gas to a container according to a preferred embodiment of the present invention, with respect to a stocker including a frame to which a plurality of cell supports not including a cleaning gas supplying nozzle are configured to be attached along the vertical direction or the horizontal direction includes a step of attaching a stocker unit to the stocker, the stocker unit including a base including a column or a beam, a pipe configured to supply cleaning gas that is provided along the base, and a plurality of cell supports including a purge function that are attached to the base along the vertical direction or the horizontal direction and each include a nozzle configured to supply cleaning gas from the pipe, and the stocker unit being attached to the stocker by attaching the base to the frame, and a step of supplying cleaning gas from the nozzles to the containers supported by the cell supports including a purge function.

According to a preferred embodiment of the present invention, the purge function for supplying cleaning gas to a container through a nozzle may be added by attaching the stocker unit to the frame of the stocker. The stocker unit including the purge function and cell supports not including the purge function may be attached to the frame of the stocker. Also, the stocker unit including the purge function may be incorporated into an existing stocker. Note that in this specification, descriptions regarding the stocker directly apply to the stocker unit and the method for supplying a cleaning gas as well, and descriptions regarding the stocker unit directly apply to the stocker as well.

It is preferable that the frame includes a container accommodating space and at least a pair of first columns at a rear end of the space, the base includes at least a pair of second columns at a rear end of the container accommodating space, a gap between the second columns is narrower than a gap between the first columns, and the second columns are located diagonally forward of the first columns in a view from ahead of the container accommodating space, and are attached to the first columns.

The stocker unit may be easily attached to the stocker by incorporating the stocker unit into the stocker such that the second columns of the stocker unit are located diagonally forward of the first columns of the frame of the stocker, and then attaching the second columns to the first columns.

It is preferable that the cell supports including a purge function further include a branch line configured to supply cleaning gas from the pipe to the nozzle, and a valve configured to control the flow rate of cleaning gas in the branch line, and in a view from ahead of the container accommodating space, the pipe and the valve are provided rearward of front ends of the second columns and forward of rear ends of the first columns.

The space rearward of the front ends of the second columns and forward of the rear ends of the first columns tends to be empty space that does not interfere with the container. A space-saving stocker unit is preferably achieved by providing the pipe and the valve in this space.

It is preferable that a plurality of cell supports not including a cleaning gas supplying nozzle are attached to the frame, and the stocker unit is attached to the frame. In other words, cell supports not including the cleaning gas supplying nozzle and cell supports including the purge function and including the cleaning gas supplying nozzle coexist in the same stocker.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is an enlarged front view of a relevant portion of stocker shelves according to a preferred embodiment of the present invention.

DETAILED DESCRIPTION OF THE PREFERRED EMBODIMENTS

The following describes various preferred embodiments of the present invention. The scope of the present invention is based on the claims, and is intended to be determined in accordance with the understanding of a person skilled in the art with reference to the description of various preferred embodiments of the present invention and well-known techniques in the field of the present invention.

Figure 1:
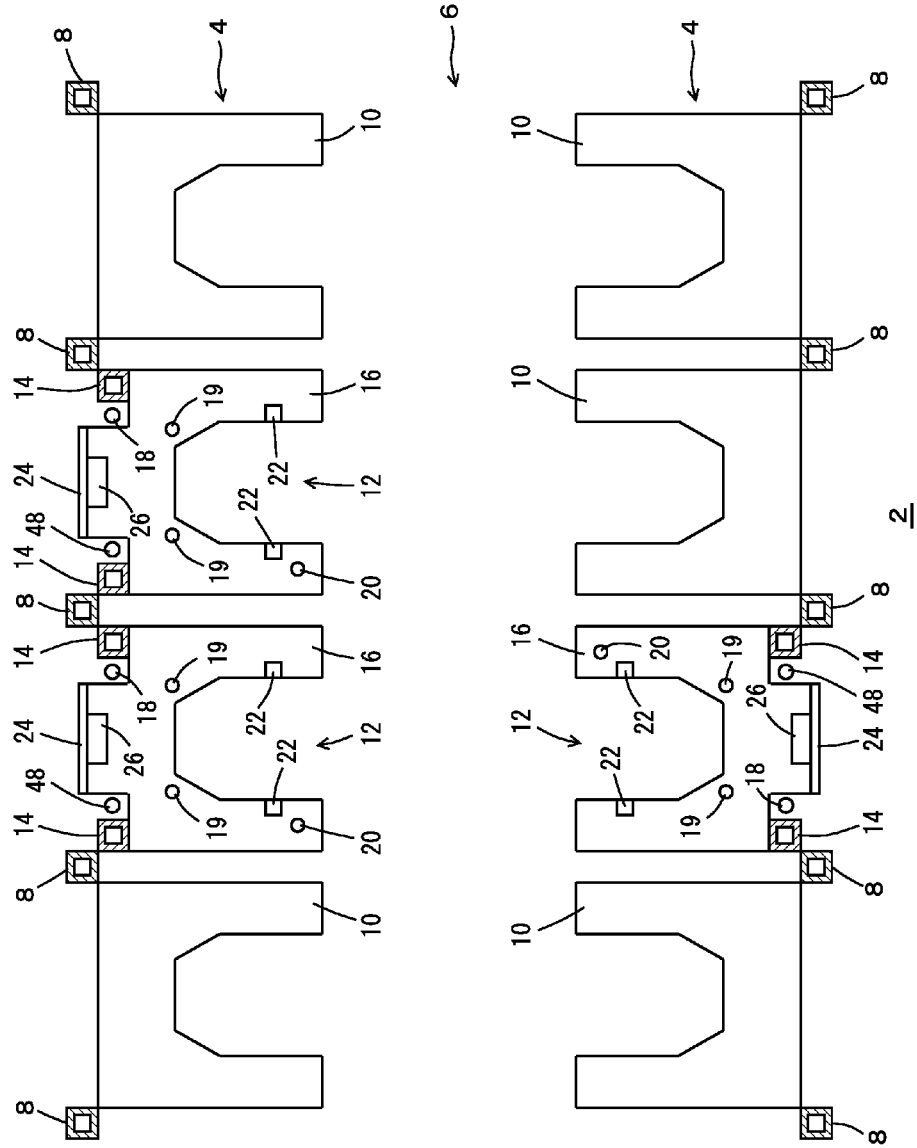
FIG. 1 is a plan view of a relevant portion of a stocker according to a preferred embodiment of the present invention.
Figure 2:
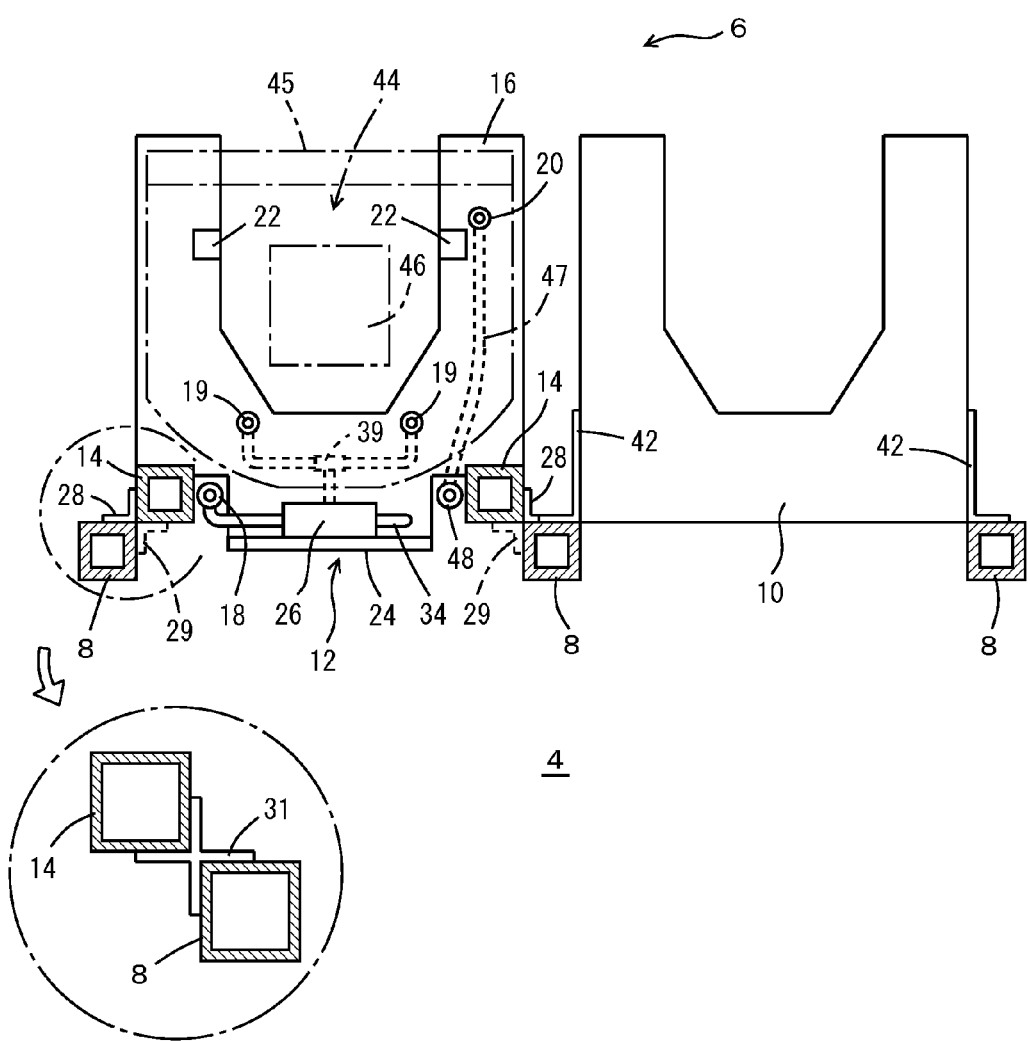
FIG. 2 is an enlarged plan view of a relevant portion of FIG. 1.

FIGS. 1 to 3 show a stocker 2 and stocker units 12 according to a preferred embodiment of the present invention. FIG. 1 shows the overall structure of the stocker 2. For example, the space between a pair of shelves 4, 4 is a transport device space, and a transport device such as stocker crane (not shown) travels through this space. Also, some of the shelves 4, 4 are provided with a load port (not shown) to perform loading and unloading, and containers such as FOUPs or SMIF pods are exchanged with an overhead traveling vehicle (not shown) or the like. The transport device is configured to transport containers between a load port and a shelf 4, and between shelves 4, 4, for example. The front side of the shelves 4, 4 is the space 6 side, and the rear side of the shelves 4, 4 is the opposite side.

Multiple columns 8 are provided at the rear ends of the shelves 4, 4, and multiple cell supports 10 are attached in a vertical arrangement to each pair of columns 8, 8. Also, a stocker unit 12 including a purge function is attached to each pair of columns 8, 8. Each stocker unit 12 includes a pair of vertical columns 14, 14 at the rear end, and also a purging line 18 including a tube parallel or approximately parallel with the columns 14. Cleaning gas such as dry nitrogen or cleaned and dried air may be supplied from a pipeline or the like provided in the facility to the interior of containers. Multiple cell supports 16 are provided in a vertical arrangement in a state of being supported by a pair of columns 14, 14, and the purging line 18 vertically passes through the cell supports 16. Each cell support 16 is provided with nozzles 19, 19 configured to blow cleaning gas into the container and a nozzle 20 configured to discharge cleaning gas from the container. Note that each cell support 16 may be provided with one nozzle 19, and may also be provided with two nozzles 20 configured to discharge on the left and right sides. It should also be noted that in the case where the cleaning gas is naturally discharged through a gap between the body and the lid of the container, the nozzle 20 configured to discharge is not needed. Load presence sensors 22 are configured to detect the presence and absence of a container supported on the cell support 16. Although each cell support 16 is provided with two load presence sensors 22, it may be provided with three or more, or one. Also, a configuration is possible in which the load presence sensors 22 are not provided, and the presence and absence of containers is determined based on data indicating the loading and unloading of containers onto and from the cell supports 16 by the transport device.

FIGS. 2 and 3 show details of the stocker unit 12. The rear end portion of the cell support 16 is bent vertically upward and constitutes a vertical plate 24. A controller 26, a flow meter 36, and a valve 38 are attached to the vertical plate 24. A branch line 34 of each cell support 16 is connected to a purging line 18 via a joint 32, the controller 26 opens the valve 38 in accordance with a signal from the load presence sensors 22, and the flow rate in the branch line 34 is monitored by the flow meter 36 and fed back to the valve 38 such that the cleaning gas flows through the branch line 34 with a constant flow rate. The branch line 34 is bifurcated by a joint 39, and the nozzles 19, 19 introduce the cleaning gas into an FOUP 44 via gas introduction holes in the FOUP 44. Note that 45 indicates a lid of the FOUP 44, and 46 indicates a handle configured to be grasped by an overhead traveling vehicle. Nitrogen gas discharged through the nozzle 20 is recovered via a discharge pipe 47 and a discharge line 48 constituted by a tube parallel or approximately parallel with the columns 14. Also, 42 indicates attachment members configured to attach the cell support 10 to the columns 8.

The columns 8 correspond to the first columns in the claims, the columns 14 correspond to the second columns in the claims, and the columns 8 are main portions of the frame of the stocker 2. The space between the front end of a column 14 and the rear end of a column 8, and particularly the space between the rear end of the FOUP 44 and the rear end of a column 8, tends to be empty space. In view of this, the purging line 18, the controller 26, the flow meter 36, the valve 38, and the like are accommodated in this space. The columns 14, 14 are arranged diagonally forward of the columns 8, 8, and the gap between the columns 14, 14 is narrower than the gap between the columns 8, 8. The columns 14 are fastened to the respective columns 8 using an L-shaped member 28 and fastening members 30. Also, the rear side of the FOUP 44 is shaped so as to be tapered toward the rear end in a plan view, that is to say is shaped such that the horizontal width decreases toward the rear end. For example, even in the case of being arc-shaped in a plan view, a cutout shape may be formed by chamfering the left and right sides. This shape makes it possible to provide the columns 14 at positions that do not interfere with the FOUP 44. Note that the L-shaped member may be arranged on the rear end side of each column 14 as shown by dashed lines 29 in FIG. 2, or a cross-shaped attachment piece 31, for example, may be used as shown in the enlargement at the bottom of FIG. 2. Appropriate design modification may be made according to the configuration of the stocker, for example.

The horizontal width of the stocker unit 12 is approximately the same as the width of the cell supports 10, and the stocker unit 12 may be disposed between a pair of columns 8, 8 of a shelf 4. For this reason, the purge function may be added to an existing stocker that does not include the purge function, for example, by incorporating the stocker unit 12. Also, the stocker 2 may be provided with cell supports 16 including the purge function and cell supports 10 not including the purge function, and it is possible to remove a cell support 10 and replace it with a stocker unit 12, or remove a stocker unit 12 and replace it with a cell support 10.

Although multiple cell supports 16 are aligned vertically in the stocker unit 12, they may be aligned horizontally. In this case, a pair of beams are provided in a vertically overlapping manner in place of the columns 14, 14, and the pair of beams are attached to beams or the like of the stocker frame. The tops and bottoms of the vertical plates 24 are then attached to the pair of horizontal beams. In this case, multiple cell supports 10 are aligned in the lengthwise direction of the beams.

Cleaning gas is supplied to the purging line 18 by a pipeline provided in the facility. Note that a portable gas bomb or the like may be used. In this case, a bomb or the like for supplying cleaning gas to the purging line 18 is arranged at an appropriate location, such as directly below a stocker unit 12. Also, the stocker unit 12 may be manufactured separately from the stocker 2 and attached to the stocker 2 using the columns 8, 8.

The following effects are obtained by the above-described preferred embodiment of the present invention.

An existing stocker not including the purge function may be easily modified into a stocker 2 including the purge function.

Cell supports 16 including the purge function and cell supports 10 not including the purge function may be arranged in any ratio in the stocker 2.

By setting the gap between the columns 14, 14 narrower than the gap between the columns 8, 8, the stocker unit 12 may be easily incorporated into the stocker 2 using the L-shaped member 28.

The pipe 18, the controller 26, the flow meter 36, the valve 38, and the like may be arranged in the empty space rearward of the FOUP 44.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A stocker including a purge function comprising:
a frame to which a plurality of first cell supports not including a cleaning gas supplying nozzle are configured to be attached along a vertical direction or a horizontal direction, and which includes a container accommodating space and a pair of first columns at a rear end of the container accommodating space; and
a stocker unit including:
a base attached to the frame and including a pair of second columns at the rear end of the container accommodating space;
a pipe configured to supply cleaning gas provided along the base; and
a plurality of second cell supports including a purge function and supported by the pair of second columns; wherein
the second cell supports including a purge function are attached to the base, are aligned along the vertical direction or the horizontal direction, are configured to support a container, and each include a respective nozzle configured to supply cleaning gas from the pipe to the container, a respective branch line configured to supply cleaning gas from the pipe to the respective nozzle configured to supply cleaning gas, a respective controller, a respective valve configured to control a flow rate of cleaning gas in the respective branch line, and a respective flow meter;
the second columns are attached to the first columns, and in a view from in front of the container accommodating space, the second columns are located diagonally forward of the first columns and a gap between the second columns is narrower than a gap between the first columns; and
in the view from in front of the container accommodating space, the pipe, the respective controller, the respective valve, and the respective flow meter are provided forward of rear ends of the first columns and rearward of front ends of the second columns.

2. The stocker according to claim 1, wherein the plurality of first cell supports not including a cleaning gas supplying nozzle are attached to the frame, and the stocker unit is attached to the frame.

3. The stocker according to claim 1, wherein, in the view from in front of the container accommodating space, the respective nozzle configured to supply cleaning gas is provided forward of front ends of the first columns.

4. A method for supplying cleaning gas to a container with respect to a stocker including a frame to which a plurality of first cell supports not including a cleaning gas supplying nozzle are configured to be attached along a vertical direction or a horizontal direction, and which includes a container accommodating space and a pair of first columns at a rear end of the container accommodating space, comprising:
a step for attaching a stocker unit to the stocker, the stocker unit including a base including a pair of second columns at the rear end of the container accommodating space, a pipe configured to supply cleaning gas provided along the base, and a plurality of second cell supports including a purge function that are attached to the base along the vertical direction or the horizontal direction, that are supported by the pair of second columns, and that each include a respective nozzle configured to supply cleaning gas from the pipe, a respective branch line configured to supply cleaning gas from the pipe to the respective nozzle configured to supply cleaning gas, a respective controller, a respective valve configured to control a flow rate of cleaning gas in the respective branch line, and a respective flow meter, and the stocker unit being attached to the stocker by attaching the second columns to the first columns such that, in a view from in front of the container accommodating space, the second columns are located diagonally forward of the first columns, a gap between the second columns is narrower than a gap between the first columns, and the pipe, the respective controller, the respective valve, and the respective flow meter are provided forward of rear ends of the first columns and rearward of front ends of the second columns; and
a step for supplying cleaning gas from the respective nozzle configured to supply cleaning gas to the container supported by the second cell supports including a purge function.

5. The method according to claim 4, wherein the step for attaching the stocker unit to the stocker further includes attaching the second columns to the first columns such that the respective nozzle configured to supply cleaning gas is located forward of front ends of the first columns.

* * * * *